(12) United States Patent
Phan

(10) Patent No.: US 6,861,635 B1
(45) Date of Patent: Mar. 1, 2005

(54) BLOOMING CONTROL FOR A CMOS IMAGE SENSOR

(75) Inventor: Christina P. Phan, San Jose, CA (US)

(73) Assignee: Eastman Kodak Company, Rochester, NY (US)

( * ) Notice: Subject to any disclaimer, the term of this patent is extended or adjusted under 35 U.S.C. 154(b) by 72 days.

(21) Appl. No.: 10/273,956

(22) Filed: Oct. 18, 2002

(51) Int. Cl.[7] ............................................. H01L 27/00
(52) U.S. Cl. ...................................... 250/208.1; 326/34
(58) Field of Search ......................... 250/208.1; 326/34, 326/24, 121, 81; 257/223, 230, 445, 444, E27.139, E27.133, E27.13; 438/79, 75

(56) References Cited

U.S. PATENT DOCUMENTS

| 5,465,054 A | * 11/1995 | Erhart ........................ 326/34 |
| 5,578,957 A | 11/1996 | Erhart et al. ................ 327/333 |
| 5,604,449 A | 2/1997 | Erhart et al. .................. 326/81 |

* cited by examiner

Primary Examiner—Thanh X. Luu
Assistant Examiner—Seung C. Sohn
(74) Attorney, Agent, or Firm—Darby & Darby P.C.

(57) ABSTRACT

A high voltage reset circuit with blooming control that increases the dynamic range of a CMOS image sensor and prevents blooming from occurring in output images. The circuit includes a high voltage supply circuit and a high voltage level shifter circuit. The high voltage supply circuit is configured to supply a voltage to the shifter circuit. The voltage has a voltage level higher than the absolute maximum voltage of the associated fabrication process. The shifter circuit is configured to output a high reset signal based on a reset signal generated to reset a pixel circuit of a pixel array. Instead of the reset signal, the high reset signal is coupled to a gate of the reset transistor in the pixel circuit. The high reset signal allows the reset transistor to maintain a gate to source potential less than the absolute maximum voltage even when the high reset signal is greater than the absolute maximum voltage. The high voltage level shifter circuit includes a high voltage inverter arranged to raise the low level of the high reset signal by a predetermined voltage and to control the rising and falling edges of the $RESET_H$ signal. This prevents a photodiode in the pixel circuit from becoming forward biased and prevents blooming from occurring within the image sensor.

24 Claims, 5 Drawing Sheets

BLOOMING CONTROL FOR A CMOS IMAGE SENSOR

FIELD OF THE INVENTION

The present invention relates generally to CMOS image sensors, and more particularly to integrated CMOS transistor logic circuits for correcting a blooming effect within the CMOS image sensor.

BACKGROUND OF THE INVENTION

Given certain conditions, digital pictures taken with a digital camera using complimentary metal-oxide semiconductor (CMOS) image sensors may display an image defect in the output image. The image defect occurs most prevalently in output images with large contrasts. The image defect makes certain areas within the output image appear brighter in comparison with the original image. For example, if the original image has a very bright spot surrounded by a dark area, the output image will display the dark area as being brighter than the dark area in the original image.

This image defect is caused by a phenomenon commonly referred to as "blooming." Blooming occurs when neighboring pixels collect electrons that have been injected into the substrate by another pixel. A pixel will inject electrons into the substrate when the photodiode of the pixel becomes forward biased due to a very large photocurrent across the photodiode (i.e., original image had a bright line condition).

FIG. 1 is a schematic 100 of a conventional pixel cell architecture for an individual pixel. The pixel cell architecture includes three transistors and will be hereinafter referred to as a 3-T pixel cell. The 3-T pixel cell includes a photodiode 108, an NMOS transistor 102, an NMOS transistor 104 and an NMOS transistor 106. The transistor 102 is employed to reset the pixel cell, transistor 104 operates as a source follower voltage buffer and transistor 106 is employed to select the pixel cell. The drains of transistor 102 and transistor 104 are coupled to the positive rail of the power supply (Vcc). The drain of transistor 106 is coupled to the source of transistor 104. The source of transistor 102 is coupled to the gate of transistor 104 and the cathode of the photodiode 108 at Node A. A parasitic capacitance ($C_P$) at the gate of transistor 104 and a depletion layer capacitance ($C_D$) of photodiode 108 appear at node A. The gate of transistor 102 is coupled to a reset line and the gate of transistor 106 is coupled to a select line. The bodies of transistors 102, 104 and 106 are coupled to the substrate at PWRN. Also, the anode of the photodiode 108 is coupled to the substrate at PWRN.

In operation, a positive pulse is applied to the gate of reset transistor 102 so that a positive bias voltage is applied at the cathode of the photodiode 108 and the depletion layer capacitance ($C_D$) of the photodiode will charge up. After the reset transistor 102 turns off, photodiode 108 remains biased at the positive bias voltage because of the charge stored in its depletion layer capacitance ($C_D$). However, when photons (light) are incident on photodiode 108, a photocurrent (not shown) will flow from the cathode to the anode of the photodiode. The photocurrent discharges the photodiode's depletion layer capacitance ($C_D$) and causes the voltage across the photodiode 108 to drop. After a certain time interval (i.e., the integration time), a positive pulse (i.e., row select) is applied to the gate of row select transistor 106. This connects the output of source follower transistor 104 to the column readout line so that the output signal voltage ($V_{DIODE}$) can be read out through the source follower transistor 104 on the column line at the source of the select transistor 106.

As mentioned above, blooming occurs when the photocurrent is very large. When the photocurrent is very large, node A can be discharged and may become at a lower potential than PWRN. If this occurs, photodiode 108 becomes forward biased, which causes the injection of charge carriers into the substrate. The charge carriers (i.e., electrons) in the substrate are then collected by neighboring pixels. Thus, these additional charge carriers that are collected impact the read out of the output signal voltage for the neighboring pixel and will result in the image defect described above.

Traditionally, the low level (i.e., "off") of the reset signal is at ground (i.e., PWRN). In conventional image sensors that prevent photodiode 108 from becoming forward biased, the logic low level (i.e., "off") of the reset signal is raised so that the photodiode 108 is well in reverse bias region. By raising the low level of reset to 1V, the cathode of photodiode 108 will be at 1V minus the threshold voltage of transistor 102, which is around 0.3V. Briefly, turning to FIG. 2, in a conventional image sensor, the RESET signal generated by mux 14 is supplied directly to pixel 12 (i.e., transistor 102 in FIG. 1). Then, to implement the blooming control, an external source of 1V is applied to mux 14. As a result, the output of mux 14, the RESET signal, that goes directly to pixel 12 will have the desirable logic low level of 1V. However, as shown in FIG. 2, in an image sensor implementing a high voltage reset circuit 204, inputting the 1V source at mux 14 will not produce the desired effect. Firstly, the high voltage level shifter will dissipate significant power. Secondly, the output signal (i.e., $RESET_H$) will have a low logic level of 0V, rather than the desired 1V. Therefore, blooming will occur in image sensors implementing a high voltage reset circuit.

SUMMARY OF THE INVENTION

The present invention is directed at a circuit for controlling the blooming effect in CMOS image sensors designed with a high voltage reset. In this regard, the circuit includes a high voltage supply circuit and a high voltage level shifter circuit. The high voltage supply circuit is configured to supply a voltage to the shifter circuit. The voltage has a voltage level higher than the absolute maximum voltage of the associated fabrication process. The shifter circuit is configured to output a high reset signal based on a reset signal generated to reset a pixel circuit of a pixel array. Instead of the reset signal, the high reset signal is coupled to a gate of the reset transistor in the pixel circuit. The high reset signal allows the reset transistor to maintain a gate to source potential less than the absolute maximum voltage associated with the fabrication process to avoid gate oxide breakdown even when the high reset signal is greater than the absolute maximum voltage. The high voltage level shifter circuit includes a high voltage inverter. The high voltage inverter is arranged to control the rising and falling edges of the $RESET_H$ signal. In addition, the high voltage inverter is arranged to raise the low level of the high reset signal by a predetermined voltage, thereby preventing a photodiode in the pixel circuit from becoming forward biased.

DETAILED DESCRIPTION OF THE PREFERRED EMBODIMENT

Figure 1:
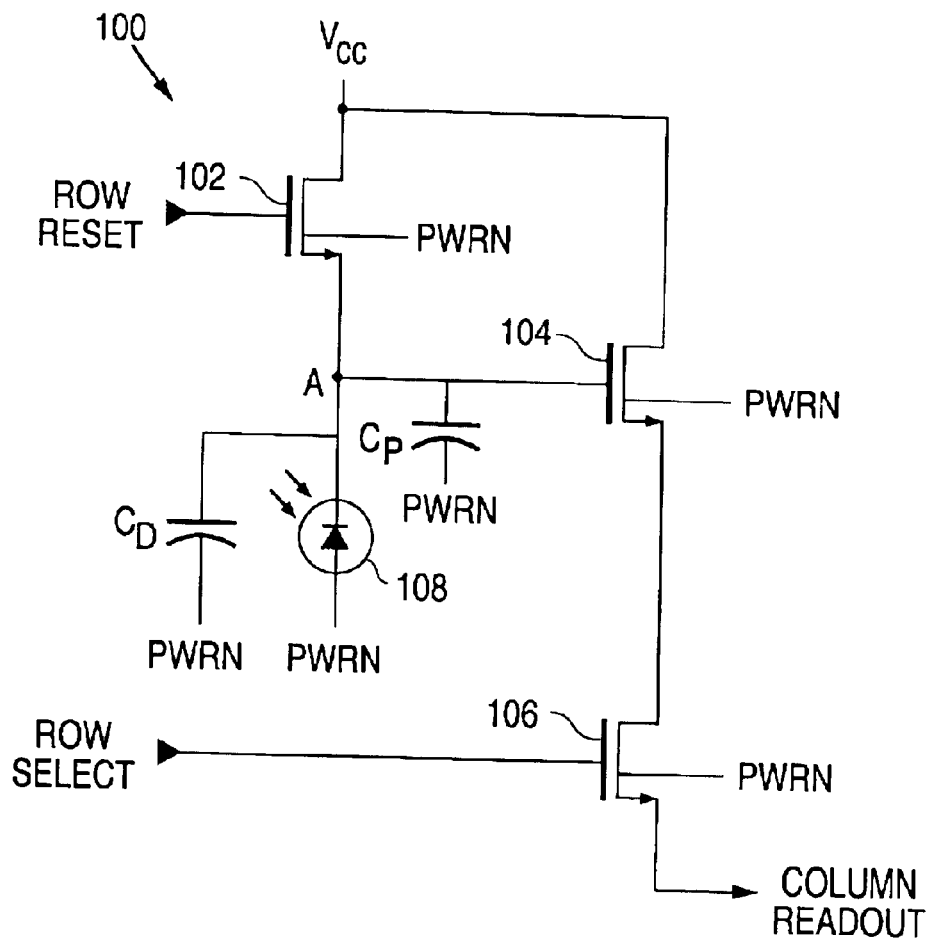
FIG. 1 is a schematic diagram of a conventional pixel cell architecture for an individual pixel.

Briefly described, the present invention is directed at a circuit for controlling blooming within CMOS image sensors that are designed with a high voltage reset. FIG. 2 is a block diagram of an exemplary embodiment of several components for an image sensor employing a high voltage reset circuit. As shown, the image sensor 200 of the present invention includes an array 24 of individual pixel cells 12, such as pixel cell 100 shown in FIG. 1, arranged in columns and rows. A processor 18 is coupled to an input/output interface 22, a memory 20 and a row multiplexer 14, which is employed to reset and select each row of the pixel cell array 24. The processor 18 is also coupled to a column multiplexer 16 that is employed to read the value at each column for a selected row of pixel cells 12. The image sensor 200 further includes a high voltage reset circuit, shown generally within outlined box 201 and hereinafter referred to as high voltage reset circuit 201. The high voltage reset circuit 201 includes a high voltage charge pump 202 and a plurality of high voltage level shifter circuits 204. High voltage charge pump 202 accepts a supply voltage input (i.e., a 3.3 volt supply voltage) and supplies a higher supply voltage output (i.e., 4.5 volt supply voltage). The higher supply voltage output is supplied to each of the high voltage level shifter circuits 204. In addition, each of the high voltage level shifter circuits 204 accepts a reset signal (RESET) from mux 14 that corresponds to one of the rows of pixels 12. Based on these inputs, each high voltage level shifter circuit 204 generates a high voltage reset signal (RESET$_H$) for one of the rows in the pixel array.

The high voltage level shifter circuits 204 are designed in a manner such that the low to high transition of the high voltage reset signal (RESET$_H$) to the reset transistor will be slow. This guarantees that the potential on the node associated with the photodiode and the source of the reset transistor can follow the potential on the reset line. This prevents the breakdown of the gate oxide in the reset transistor even when the potential on the gate is larger than the absolute maximum voltage.

Because, high voltage reset circuit 201 is coupled between mux 14 and each pixel 12, the traditional method for controlling blooming will not work. As discussed above, in image sensors implementing the high voltage reset circuit 204, inputting the 1V source at mux 14 will not produce the desired effect. Firstly, the high voltage level shifter will dissipate significant power. Secondly, the output signal (i.e., RESET$_H$) will still have a low logic level of 0V, rather than the desired 1V. Thus, in accordance with the present invention, the high voltage reset circuit 201 controls the blooming. An exemplary high voltage reset circuit that controls blooming is described below. However, those skilled in the art will appreciate other variations of high voltage level shifter circuits may be adapted to control blooming using the teachings of the present invention. For some variations of high voltage level shifter circuits, see copending patent application Ser. No. 09/939,217 entitled, "High Voltage Reset Method for Increasing the Dynamic Range of a CMOS Image Sensor", which is hereby incorporated by reference.

Figure 2:
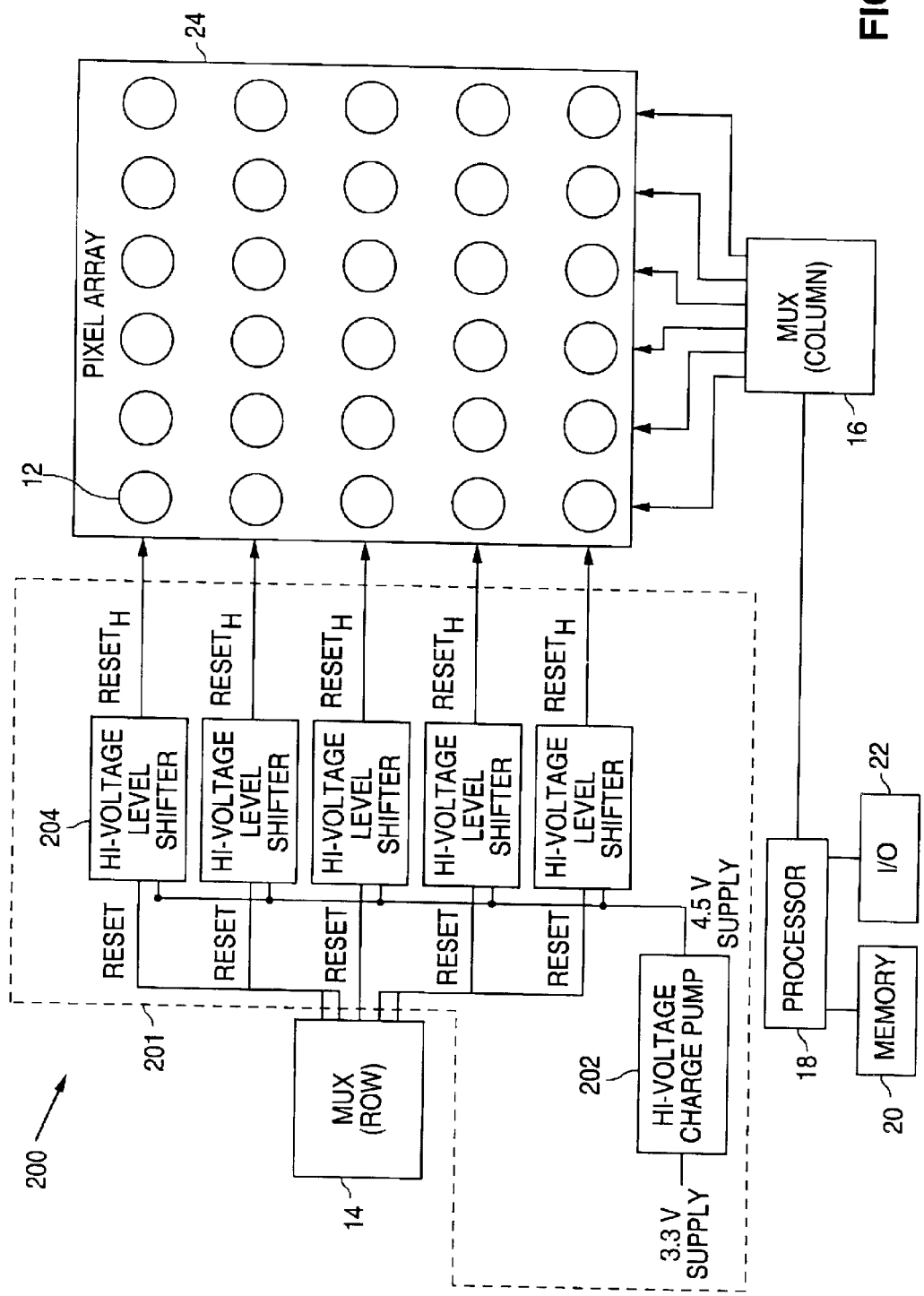
FIG. 2 is a block diagram of an exemplary embodiment of an image sensor that incorporates a high voltage reset for increasing the dynamic range of the image sensor.
Figure 3:
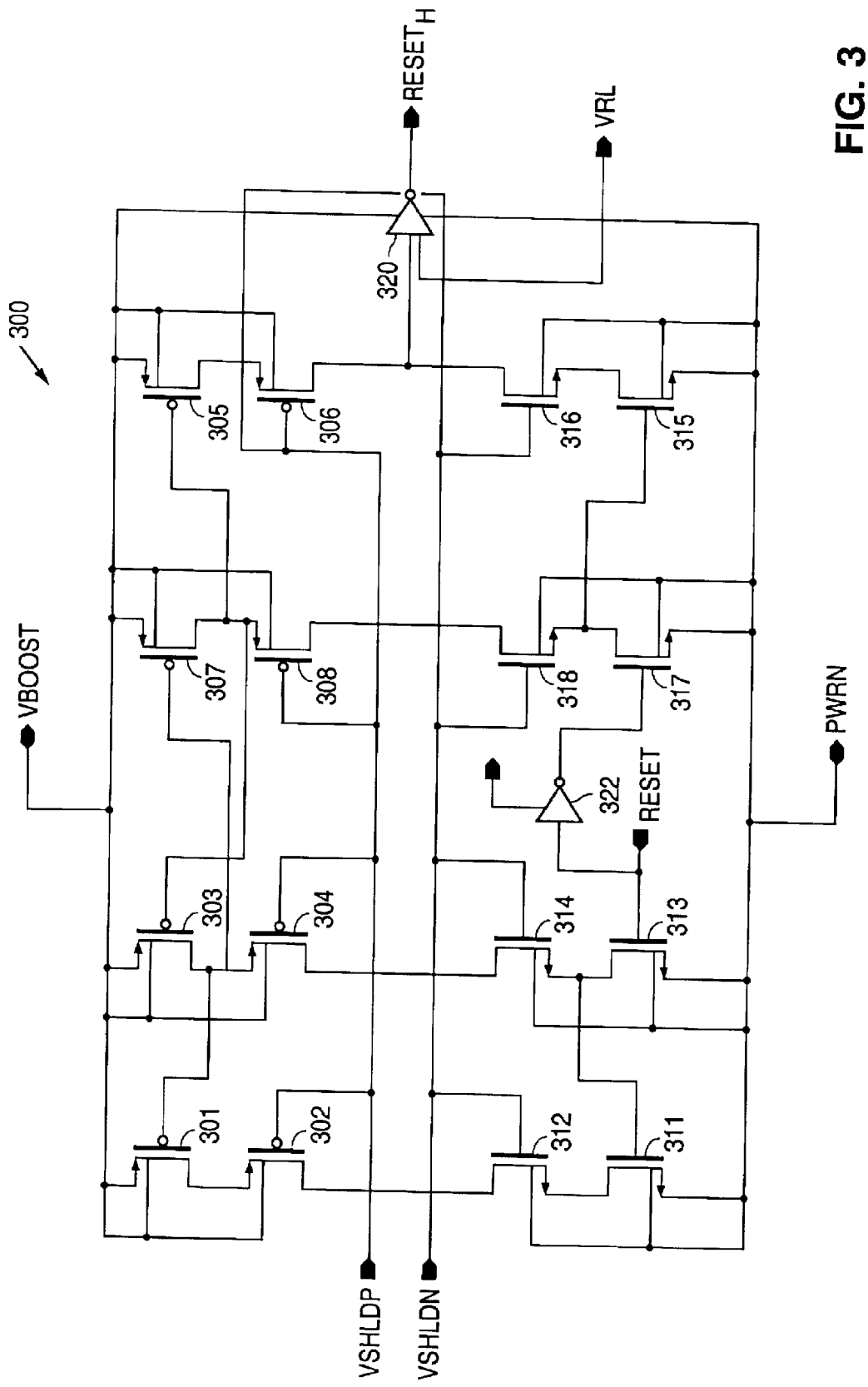
FIG. 3 is a schematic diagram of one embodiment of a high voltage level shifter circuit shown in FIG. 2 that implements a slow rise high voltage output with blooming control in accordance with the present invention.

FIG. 3 is a schematic diagram of one embodiment of the high voltage level shifter shown in FIG. 2 that implements blooming control in accordance with the present invention. The high voltage level shifter circuit 300 includes a first p-channel CMOS output switching transistor 301, a first p-channel CMOS output shielding transistor 302, a first p-channel CMOS input switching transistor 303, a first p-channel CMOS input shielding transistor 304, a second p-channel CMOS input switching transistor 305, a second p-channel input shielding transistor 306, a second p-channel CMOS output switching transistor 307, and a second p-channel CMOS output shielding transistor 308.

In addition, the high voltage level shifter circuit 300 includes a first n-channel CMOS output switching transistor 311, a first n-channel CMOS output shielding transistor 312, a first n-channel CMOS input switching transistor 313, a first n-channel CMOS input shielding transistor 314, a second n-channel CMOS input switching transistor 315, a second n-channel input shielding transistor 316, a second n-channel CMOS output switching transistor 317, and a second n-channel CMOS output shielding transistor 318. High voltage level shifter circuit 300 further includes a high voltage inverter 320 and an inverter 322.

In this example, it will be assumed that each of the above transistors is produced using a typical low-voltage (e.g., 3.3 volt) CMOS process. The bulk connection for the p-channel transistors 301–308 are each coupled to a boosted supply voltage VBOOST supplied by the high voltage charge pump 202 shown in FIG. 2. In addition, the source terminal for p-channel transistors 301, 303, 305, 307 are each coupled to the boosted supply voltage VBOOST. The bulk connection for each of the n-channel transistors 311–318 is grounded. In addition, the source terminal for n-channel transistors 311, 313, 315, and 317 are each grounded.

The gate terminal of first p-channel input shielding transistor 304, first p-channel output shielding transistor 302, second p-channel output shielding transistor 308 and second p-channel input shielding transistor 306 is each coupled to a first shield voltage (VSHLDP). The gate terminal of first n-channel input shielding transistor 314, first n-channel output shielding transistor 312, second n-channel output shielding transistor 318 and second n-channel input shielding transistor 316 is each coupled to a second shield voltage (VSHLDN). As will be described in detail below, the shielding voltage is separated into the first and second shield voltage in order to control blooming. VSHLDP is selected to optimize the rising edge of the high reset signal RESET$_H$ and VSHLDN is selected to optimize the falling edge of the high reset signal RESET$_H$. In one embodiment, VSHLDP is 2.1V and VSHLDN is 3V. For the following discussion, it is assumed that VBOOST is +4.5 volts and that the reset signal received from the multiplexer 14 shown in FIG. 2 ranges from 0 to 3.3 volts.

The drain terminal of first and second p-channel output switching transistor 301 and 305 is coupled to the source terminal of first and second p-channel output shielding transistor 302 and 306, respectively. The drain terminal of first and second p-channel input switching transistor 303 and 307 is coupled to the source terminal of the first and second p-channel input shielding transistor 304 and 308, respectively. The gate terminal of first p-channel output switching transistor 301 and second p-channel output switching transistor 307 are coupled to the drain terminal of first p-channel input switching transistor 303. The gate terminal of first p-channel input switching transistor 303 and second p-channel input switching transistor 305 are coupled to the drain terminal of second p-channel output switching transistor 307.

The source terminal of first and second n-channel output shielding transistor 312 and 316 is coupled to the drain terminal of first and second n-channel output switching transistor 311 and 315, respectively. The source terminal of first n-channel shielding transistor 314 is coupled to the drain terminal of the first n-channel input switching transistor 313 and to the gate terminal of the first n-channel output switching transistor 311. The source terminal of second n-channel shielding transistor 318 is coupled to the drain terminal of the second n-channel output switching transistor 317 and to the gate terminal of the second n-channel input switching transistor 315. The drain terminal of the first and second p-channel input shielding transistor 304 and 308 is coupled to the drain terminal of the first and second n-channel input shielding transistor 314, 318, respectively.

Figure 4:
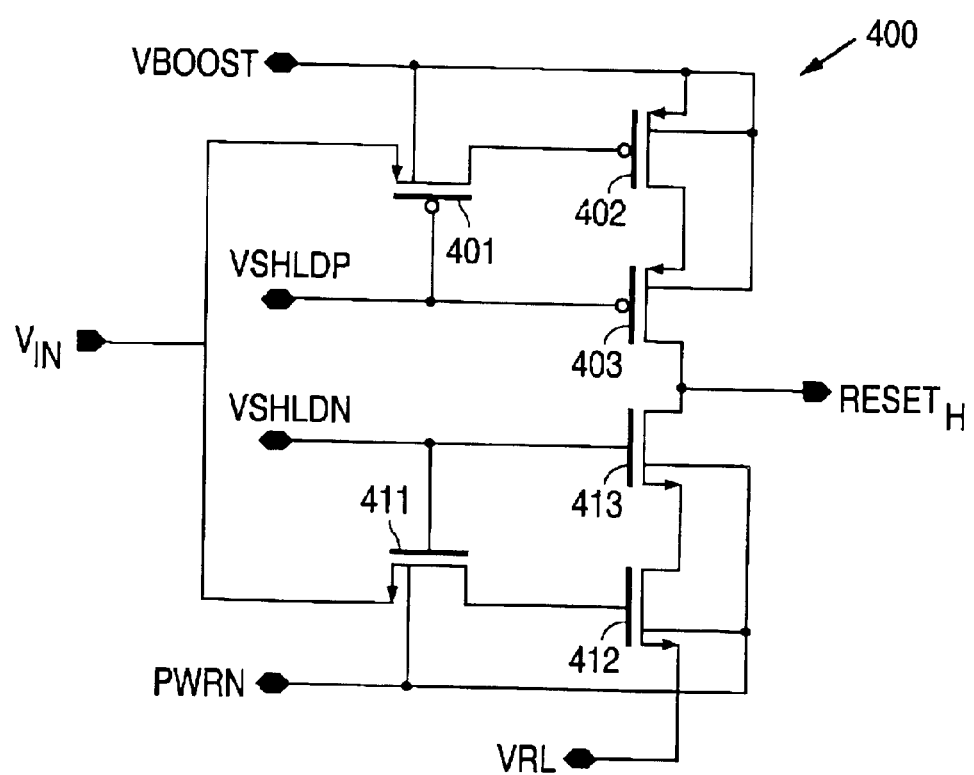
FIG. 4 is schematic diagram of one embodiment of a high voltage inverter shown in FIG. 3 with blooming control in accordance with the present invention.

The RESET signal is coupled to the gate terminal of the first n-channel input switching transistor 313 and to the input terminal of inverter 322. The output terminal of inverter 322 is coupled to the gate terminal of the second n-channel output switching transistor 317. The drain terminal of the second p-channel input shielding transistor 306 and the second n-channel input shielding transistor 316 are coupled and are input into high voltage inverter 320. The first and second shielding voltages VSHLDP and VSHLDN are supplied to the high voltage inverter 320, which outputs the high reset signal $RESET_H$. In addition, a raised logic low signal (VRL) is supplied to the high voltage inverter 320. The high voltage inverter 320 is employed to buffer, shift, and invert the ground to VBOOST signal to a raised low signal (VRL) to VBOOST signal. As such, the operation of the high voltage level shifter circuit 300 converts the RESET input signal to a high reset signal $RESET_H$. Input signal RESET is approximately a square wave. For the following example, RESET ranges from 0.0 volts to 3.3 volts. Thus, $RESET_H$ ranges from 1.0 volts to VBOOST. In FIG. 3, the shielding voltage is shown separated into the first and second shielding voltages, VSHLDP and VSHLDN, which are used throughout the high voltage level shifter circuit 300. However, it should be noted that the high voltage level shifter circuit 300 may operate with one shielding voltage, such as VMID, which may be set mid range between VBOOST and 0.0V. However, as will be described in detail in conjunction with FIG. 4, the high voltage inverter 320 operates with the separated shielding voltages, VSHLDP and VSHLDN. By operating the high voltage level shifter circuit 300 using the first and second shielding voltage as shown in FIG. 3, the other voltage, VMID, does not need to be generated. FIG. 4 is schematic diagram of one embodiment of a high voltage inverter shown in FIG. 3 with blooming control in accordance with the present invention. The high voltage inverter circuit 320 includes a p-channel CMOS input shielding transistor 401, a p-channel CMOS switching transistor 402, a p-channel CMOS output shielding transistor 403. The high voltage inverter circuit 320 also includes an n-channel CMOS input shielding transistor 411, an n-channel CMOS switching transistor 412, an n-channel CMOS output shielding transistor 413.

Conceptually, the p-channel CMOS input shielding transistor 401, the p-channel CMOS switching transistor 402, and the p-channel CMOS output shielding transistor 403 may be viewed as single transistor (i.e., supertransistor) having a gate (G) that corresponds to the drain terminal of the p-channel CMOS input shielding transistor 401, a source (S) that corresponds to the source terminal of the p-channel CMOS switching transistor 402, and a drain (D) that corresponds to the drain terminal of the p-channel CMOS switching transistor 402. Likewise, the n-channel CMOS input shielding transistor 411, the n-channel CMOS switching transistor 412, and the n-channel CMOS output shielding transistor 413 may be viewed as single transistor (i.e., supertransistor) having a gate (G) that corresponds to the drain terminal of the n-channel CMOS input shielding transistor 411, a source (S) that corresponds to the source terminal of the n-channel CMOS switching transistor 412, and a drain (D) that corresponds to the drain terminal of the n-channel CMOS switching transistor 412.

In this example, it will be assumed that each of the above transistors is produced using a typical low-voltage (e.g., 3.3 volt) CMOS process. The bulk connection for the p-channel input shielding transistor 401, the p-channel switching transistor 402, and the p-channel output shielding transistor 403 are each coupled to a boosted supply voltage VBOOST supplied by the high voltage charge pump 202 shown in FIG. 2. The source terminal of p-channel switching transistor 402 is also coupled to VBOOST. The bulk connection for each of the n-channel transistors 411–413 is grounded.

The drain terminal of p-channel input shielding transistor 401 is coupled to the gate terminal of p-channel switching transistor 402. The source terminal of p-channel input shielding transistor 401 is adapted to receive input signal $V_{IN}$. The drain terminal of p-channel switching transistor 402 is coupled to the source terminal of p-channel output shielding transistor 403. The drain terminal of p-channel output shielding transistor 403 provides high reset signal $RESET_H$.

The drain terminal of n-channel input shielding transistor 411 is coupled to the gate terminal of n-channel switching transistor 412. The source terminal of n-channel input shielding transistor 411 is also adapted to receive input signal $V_{IN}$. The drain of n-channel switching transistor 412 is coupled to the source of n-channel output shielding transistor 413. The drain of n-channel output shielding transistor 413 is coupled to the drain terminal of p-channel output shielding transistor 403 to provide the high reset signal $RESET_H$.

The source terminal of n-channel switching transistor 412 is coupled to an external source. In one embodiment, the external source is set at 1V to correct for blooming. However, with just the source terminal of switching transistor 412 set to 1V, the n-channel switching transistor 412 would not be able to pass the 1V signal. Therefore, in accordance with the present invention, the shielding voltage is separated into two separate levels, VSHLDP and VSHLDN. As will be described in detail below, having two shielding voltages in combination with the raised low level on the source terminal of the n-channel switching transistor 412, prevents the photodiode in the pixel from becoming forward biased. Thus, the high inverter circuit 320 is able to control blooming. In addition, the inventor of the present invention recognized that the two shielding voltages could be set in a manner such that the upward and downward slopes of the reset high signal $RESET_H$ could be controlled. As will be shown, VSHLDP may be set to control the rising time of the upwards slope of the reset high signal $RESET_H$ and VSHLDN may be set to control the downward slope of the reset high signal $RESET_H$. First shielding voltage VSHLDP is coupled to the gate terminal of the p-channel input shielding transistor 401 and p-channel output shielding transistor 403. Likewise, second shielding voltage VSHLDN is coupled to the gate of the n-channel input shielding transistor 411 and the n-channel output shielding transistor 413. In one embodiment, first shielding voltage VSHLDP is set at 2.1V and second shielding voltage VSHLDN is set at 3.0V.

In operation, when $V_{IN}$ is at 0 volts, n-channel input shielding transistor 411 is fully conductive and will pass 0 volts to the gate of n-channel switching transistor 412. This turns n-channel switching transistor 412 off. The drain terminal of the n-channel switching transistor 412 has approximately 1.9 volts. The p-channel input shielding transistor 401 is not fully conductive so it blocks the 0 volts from reaching the gate terminal of the p-channel switching transistor 402. The p-channel input shielding transistor 401 pulls the gate terminal of p-channel switching transistor 402 to low (i.e., VSHLDP plus Vtp). This renders p-channel switching transistor fully conductive and shorts VBOOST to the drain terminal of the p-channel switching terminal 402. Because the p-channel output shielding transistor is conducting, the signal VBOOST will pass through. Thus, high reset signal $RESET_H$ is at 4.5 volts.

When $V_{IN}$ is at 4.5 volts, n-channel input shielding transistor 411 will pull the gate of n-channel switching transistor 412 high (i.e., VSHLDN less Vtn). This turns n-channel switching transistor 412 on and passes VRL to the source terminal of n-channel switching transistor 412. The p-channel input shielding transistor 401 is conductive and shorts 4.5 volts to the gate terminal of p-channel switching transistor 402. This renders p-channel switching transistor 402 non-conductive. Thus, high reset signal $RESET_H$ is at 1.0 volts (i.e., VRL). By separating the shielding voltage into two voltages, blooming is controlled while still maintaining the advantages of using a high reset signal (i.e., improved dynamic range).

Figure 5:
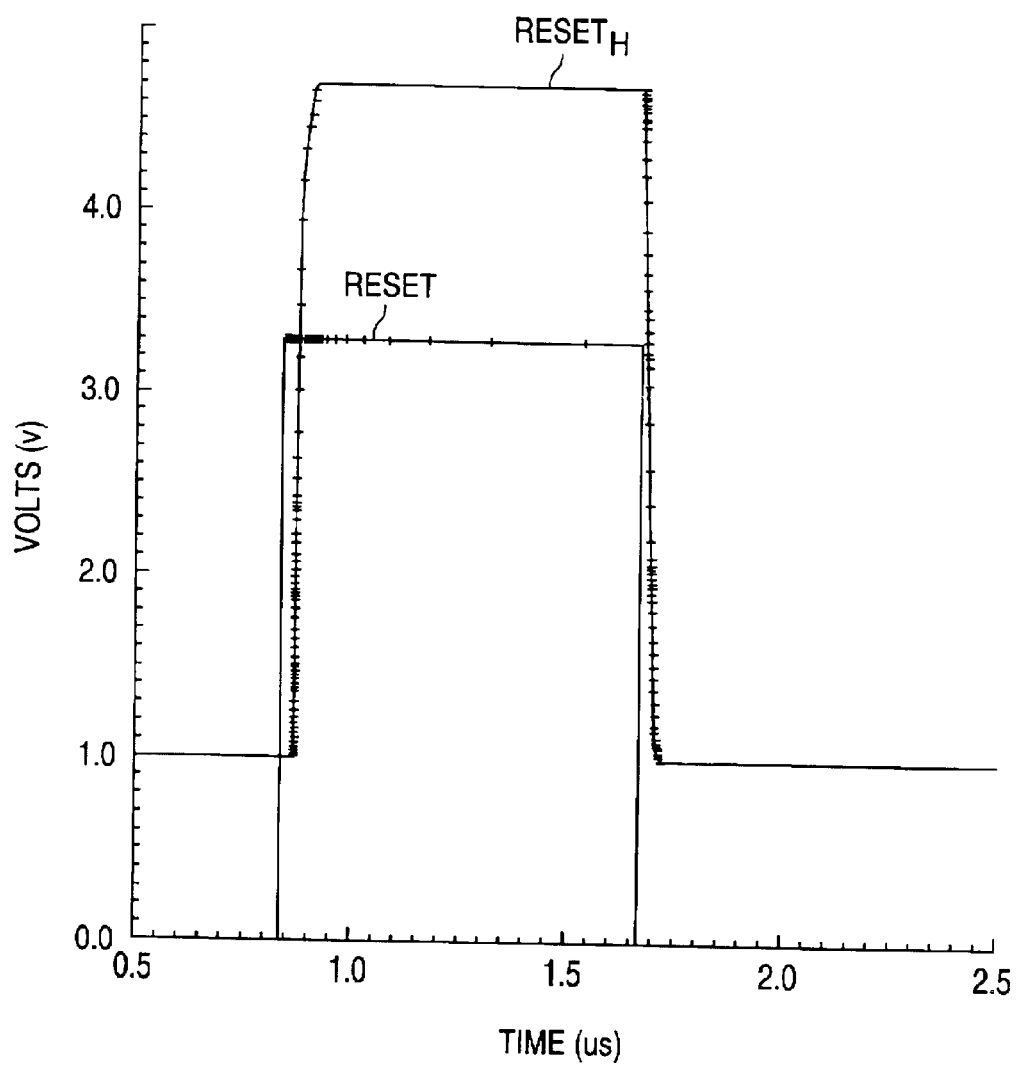
FIG. 5 is a timing diagram illustrating ideal voltage waveforms associated with the high voltage level shifter shown in FIG. 2.

FIG. 5 is a timing diagram illustrating ideal voltage waveforms associated with the high voltage level shifter circuits depicted in FIG. 4, along with ideal voltage waveforms associated with the photodiode depicted in FIG. 1, in accordance with the present invention. In this embodiment, the high voltage reset is raised in order to prevent the photodiode from becoming forward biased. The timing diagram illustrates voltage waveforms based on the 0.35 micron CMOS process. First shielding voltage VSHLDP is set at 2.1V and the second shielding voltage VSHLDN is set at 3.0V. Signal RESET is the reset signal from multiplexer 14 shown in FIG. 2. As shown, RESET is generally a square wave rising from 0.0 volts to 3.3 volts for a specified time period (i.e., 0.8 us). The high voltage level shifter circuit generates the low rising reset signal $RESET_H$ from the RESET signal and the high voltage supply $V_{BOOST}$ from the high voltage charge pump raised by 1V in the high voltage inverter 320. Signal $RESET_H$ represents the voltage at the gate of the reset transistor. As shown, signal $RESET_H$ gradually rises from 1.0 volts to 4.5 volts. In response, the potential across the photodiode $V_{DIODE}$ will gradually charges to 3.3 volts (i.e., the supply voltage for the 0.35 micron CMOS process). When VSHLDN is set at 3.0V, the $RESET_H$ signal goes down quite rapidly, instead of only gradually when the shielding voltage is not separated. This fast high to low transition (VBOOST to VRL) of reset high signal $RESET_H$ prevents blooming and provides correct timing to the pixel.

The above specification, examples and data provide a complete description of the manufacture and use of the composition of the invention. Since many embodiments of the invention can be made without departing from the spirit and scope of the invention, the invention resides in the claims hereinafter appended.

I claim:

1. A high voltage reset circuit with blooming control, the high voltage reset circuit comprises:
    a high voltage supply circuit for supplying a high supply voltage, the high supply voltage has a higher voltage level than an absolute maximum voltage of an associated CMOS fabrication process used for the CMOS image sensor; and
    a high voltage level shifter circuit arranged to receive the high supply voltage and configured to output a high reset signal, the high voltage level shifter circuit is coupled to a gate of a reset transistor in a pixel circuit of a pixel array, the gate receives the high reset signal and maintains a gate to source potential less than the absolute maximum voltage while a potential on a cathode of a photodiode, coupled to the reset transistor, charges up to a supply voltage of the associated CMOS fabrication process, the high voltage level shifter circuit includes a high voltage inverter arranged to raise the low level of the high reset signal by a predetermined voltage thereby preventing the photodiode from becoming forward biased.

2. The high voltage reset circuit of claim 1, wherein the high voltage inverter is arranged to receive a raised signal, a first shielding voltage and a second shielding voltage, the high voltage inverter includes a first and a second supertransistor, the first and second supertransistor each includes an input shielding transistor, a switching transistor, and an output shielding transistor, the gate of the input shielding transistor and the output shielding transistor associated with the first supertransistor is each coupled to the first shielding voltage, the gate of the input shielding transistor and the output shielding transistor associated with the second supertransistor is each coupled to the second shielding voltage.

3. The high voltage reset circuit of claim 2, wherein the high voltage level shifter circuit is arranged to receive a third shielding voltage.

4. The high voltage reset circuit of claim 3, wherein the first and second shielding voltages are configured to allow the predetermined voltage to pass through as the low level of the high reset signal.

5. The high voltage reset circuit of claim 3, wherein the first and second shielding voltages differ.

6. The high voltage reset circuit of claim 3, wherein the first shielding voltage is set to control the rising time of an upwards slope of the high reset signal and the second shielding voltage is set to control the downward slope of the high reset signal.

7. The high voltage reset circuit of claim 3, wherein the first shielding voltage is set at a lower voltage than the second shielding voltage.

8. The high voltage reset circuit of claim 3, wherein the source of the switching transistor associated with the first supertransistor is coupled to the predetermined voltage.

9. The high voltage reset circuit of claim 3, wherein the input shielding transistor, the switching transistor, and the output shielding transistor associated with the first supertransistor are p-channel transistors.

10. The high voltage reset circuit of claim 3, wherein the input shielding transistor, the switching transistor, and the output shielding transistor associated with the second supertransistor are n-channel transistors.

11. A circuit for providing a raised high reset signal in an image sensor, comprising:
   a means for generating a high supply voltage, the high supply voltage having a higher voltage level than an absolute maximum of an associated fabrication process used for the image sensor;
   a means for receiving a reset signal;
   a means for generating a high reset signal based on the reset signal and the high supply voltage, the high reset signal being coupled to a gate of a reset transistor in a pixel circuit of a pixel array, the high reset signal allowing the reset transistor to maintain a gate to source potential less than the absolute maximum voltage while a potential on a cathode of a photodiode, coupled to the reset transistor, charges up to a supply voltage associated with the associated fabrication process; and
   a means for preventing forward biasing of the photodiode by separating a shielding voltage into a first and second shielding voltage and applying an external source that raises a low level of the high reset signal by a predetermined voltage.

12. The circuit of claim 11, wherein the means for preventing forward biasing of the photodiode includes a high voltage inverter circuit.

13. The circuit of claim 12, wherein the high voltage inverter is arranged to receive the external source, the first shielding voltage and the second shielding voltage, the high voltage inverter includes a first and a second supertransistor, the first and second supertransistor each includes an input shielding transistor, a switching transistor, and an output shielding transistor, the gate of the input shielding transistor and the output shielding transistor associated with the first supertransistor is each coupled to the first shielding voltage, the gate of the input shielding transistor and the output shielding transistor associated with the second supertransistor is each coupled to the second shielding voltage.

14. The circuit of claim 13, wherein the first and second shielding voltages are configured to allow the predetermined voltage to pass through as the low level of the high reset signal.

15. The circuit of claim 13, wherein the first shielding voltage is set to control the rising time of an upwards slope of the high reset signal and the second shielding voltage is set to control the downward slope of the high reset signal.

16. The circuit of claim 15, wherein the first shielding voltage is set at a lower voltage than the second shielding voltage.

17. The circuit of claim 13, wherein the source of the switching transistor associated with the first supertransistor is coupled to the predetermined voltage.

18. A CMOS image sensor employing a high voltage reset circuit with blooming control, the image sensor comprises:
   a pixel array including an array of individual pixel cells arranged in columns and rows, each individual pixel cell includes a reset transistor, a source follower voltage buffer, a select transistor, and a photodiode;
   a column mux for selecting one of the columns of pixel cells; a row mux for selecting one of the rows of pixel cells;
   a processor coupled to the column mux and the row mux, the processor employed to read a value at each column for a selected row of pixel cells; and a high voltage reset circuit with blooming control comprising:
   a high voltage supply circuit for supplying a high supply voltage, the high supply voltage has a higher voltage level than an absolute maximum voltage of an associated CMOS fabrication process used for the CMOS image sensor; and
   a high voltage level shifter circuit arranged to receive the high supply voltage and configured to output a high reset signal, the high voltage level shifter circuit is coupled to a gate of the reset transistor, the gate receives the high reset signal and maintains a gate to source potential less than the absolute maximum voltage while a potential on a cathode of the photodiode, coupled to the reset transistor, charges up to a supply voltage of the associated CMOS fabrication process, the high voltage level shifter circuit includes a high voltage inverter arranged to raise the low level of the high reset signal by a predetermined voltage thereby preventing the photodiode from becoming forward biased.

19. The high voltage reset circuit of claim 18, wherein the high voltage inverter is arranged to receive a raised signal, a first shielding voltage and a second shielding voltage, the high voltage inverter includes a first and a second supertransistor, the first and second supertransistor each includes an input shielding transistor, a switching transistor, and an output shielding transistor, the gate of the input shielding transistor and the output shielding transistor associated with the first supertransistor is each coupled to the first shielding voltage, the gate of the input shielding transistor and the output shielding transistor associated with the second supertransistor is each coupled to the second shielding voltage.

20. The high voltage reset circuit of claim 19, wherein the first and second shielding voltages are configured to allow the predetermined voltage to pass through as the low level of the high reset signal.

21. A circuit for buffering, shifting, and inverting a signal to a raised signal, the circuit comprising:
   a first and a second supertransistor, each supertransistor includes an input shielding transistor, a switching transistor, and an output shielding transistor, the gate of the input shielding transistor and the output shielding transistor associated with the first supertransistor is each coupled to a first shielding voltage, the gate of the input shielding transistor and the output shielding transistor associated with the second supertransistor is each coupled to a second shielding voltage, the first and second shielding voltages are configured to allow a predetermined voltage to pass through as a low level of a high reset signal; and
   a high voltage reset circuit with a high voltage level shifter circuit arranged to receive a high supply voltage and configured to output a high reset signal, the high voltage level shifter circuit is coupled to a gate of a reset transistor in a pixel circuit of a pixel array, wherein the gate receives the high reset signal and maintains a gate to source potential less than an absolute maximum voltage while a potential on a cathode of a photodiode, coupled to the reset transistor, charges up to a supply voltage.

22. The circuit of claim 21, wherein the first shielding voltage is set to control the rising time of an upwards slope of the high reset signal and the second shielding voltage is set to control the rising time of a downward slope of the high reset signal.

23. The circuit of claim 21, wherein the first shielding voltage is set at a lower voltage than the second shielding voltage.

24. The circuit of claim 21, wherein the source of the switching transistor associated with the first supertransistor is coupled to the predetermined voltage.

* * * * *